United States Patent
Tournier et al.

(10) Patent No.: US 7,777,168 B2
(45) Date of Patent: Aug. 17, 2010

(54) IMAGE SENSOR CIRCUIT AND METHOD COMPRISING ONE-TRANSISTOR PIXELS

(75) Inventors: Arnaud Tournier, Grenoble (FR); Francois Roy, Seyssins (FR)

(73) Assignee: STMicroelectronics, SA, Montrouge (FR)

( * ) Notice: Subject to any disclaimer, the term of this patent is extended or adjusted under 35 U.S.C. 154(b) by 0 days.

(21) Appl. No.: 12/006,097

(22) Filed: Dec. 28, 2007

(65) Prior Publication Data

US 2008/0179494 A1   Jul. 31, 2008

(30) Foreign Application Priority Data

Dec. 28, 2006   (FR)   .................................. 06 56033

(51) Int. Cl.
*H01L 27/00* (2006.01)
*H01L 31/112* (2006.01)
*H03F 3/08* (2006.01)

(52) U.S. Cl. ............................... 250/208.1; 250/214 R; 257/257

(58) Field of Classification Search ............... 250/214.1, 250/208.1; 257/257, 258, 290–292, E27.133; 438/59
See application file for complete search history.

(56) References Cited

U.S. PATENT DOCUMENTS 5,317,174 A    5/1994   Hynecek
5,430,312 A *  7/1995   Yamada ........................ 257/291
5,587,596 A   12/1996   Chi et al.
6,512,547 B1 * 1/2003   Miida ........................... 348/310
2002/0024071 A1  2/2002  Kawajiri et al.
2003/0038307 A1* 2/2003  Watanabe et al. ........... 257/257
2005/0148114 A1* 7/2005  Rhodes ......................... 438/120

FOREIGN PATENT DOCUMENTS

EP   0 038 697 A1   10/1981
EP   1 128 437 A    8/2001
JP   05190847 A *   7/1993

OTHER PUBLICATIONS

French Search Report, Aug. 13, 2007, Application Nos. FA 688019 and FR 0656033, 2 pages.

* cited by examiner

*Primary Examiner*—Que T Le
*Assistant Examiner*—Jennifer Bennett
(74) *Attorney, Agent, or Firm*—Lisa K. Jorgensen; Kevin D. Jablonski; Graybeal Jackson LLP

(57) ABSTRACT

A pixel is formed in a semiconductor substrate of a first doping type, a first layer of the second doping type covering the substrate, a second layer of the first doping type covering the first layer. A MOS-type transistor is formed in the second layer and has a drain area and a source area of the second doping type. The pixel includes a first area of the second doping type, more heavily doped than the first layer, crossing the second layer and extending into the first layer and connected to the drain area. The pixel further includes a second area of the first doping type, more heavily doped than the second layer and bordering the source area.

20 Claims, 5 Drawing Sheets

IMAGE SENSOR CIRCUIT AND METHOD COMPRISING ONE-TRANSISTOR PIXELS

PRIORITY CLAIM

The present application claims priority from French patent application no. 06/56033, filed Dec. 28, 2006, which is incorporated herein by reference.

TECHNICAL FIELD

Embodiments of the present invention relate to photosensitive cells, or pixels, of an image sensor and more specifically to single transistor pixels formed in a semiconductor substrate such as a silicon wafer.

BACKGROUND

Prior art image sensors including one-transistor pixels are known. A pixel of such an image sensor comprises a MOS transistor formed in and above a semiconductor substrate. A buried semiconductor layer of a doping type opposite to that of the substrate is placed in the substrate under the transistor and delimits a substrate portion between the transistor and the buried layer. On lighting of the pixel, the charges originating from the capture of photons are stored between the transistor and the buried layer. The operation of this type of pixel requires the transistor drain to be electrically connected to the buried layer while the transistor source must remain insulated from the buried layer.

It may be difficult to simultaneously ensure a proper electric insulation of the transistor source with respect to the buried layer while putting in contact the drain and the buried layer.

SUMMARY

Embodiments of the present invention aim at a pixel of an image sensor comprising a single transistor formed above a buried layer of a semiconductor substrate, in which the source is electrically insulated from the buried layer and the drain is electrically connected to the buried layer, and that is easy to form.

Embodiments of the present invention provide a manufacturing method comprising a decreased number of steps relative to prior art methods.

One embodiment of the present invention provides a pixel comprising a semiconductor substrate of a first doping type; a first layer of the second doping type covering the substrate; a second layer of the first doping type covering the first layer; and a MOS-type transistor formed in the second layer and having a drain area and a source area of the second doping type. The pixel comprises a first area of the second doping type, more heavily doped than the first layer, crossing the second layer and extending into the first layer, and connected to the drain area; and a second area of the first doping type, more heavily doped than the second layer and bordering the source area.

According to an embodiment, the pixel comprises a portion of an insulating material placed in the second layer and surrounding the transistor, said first area extending under the portion of insulating material.

According to an embodiment, the second area extends from the portion of insulating material to the channel area of the transistor.

According to an embodiment, a reservoir area of the same doping type as the second layer but more heavily doped than said layer is placed at the level of the channel area, at the surface of the second layer.

According to an embodiment, the transistor comprises an insulated gate placed above the second layer, the source/drain areas being placed on either side of the gate in the upper portion of the second layer, the surface portion of the second layer located between the source/drain areas and under the gate forming the channel area of the transistor.

According to an embodiment, the gate and the source/drain areas of the transistor are connected to conductive lines placed above the second layer, the transistor well being floating.

According to an embodiment, the second layers of the pixels form one and the same layer.

An embodiment of the present invention also provides a method for forming a pixel, comprising the steps of (a) forming, in a semiconductor substrate of a first doping type, a portion of an insulating material surrounding an upper portion of the substrate called an active area; (b) forming, in the semiconductor substrate, a buried semiconductor layer of a second doping type; (c) forming an insulated gate above the active area; (d) masking the portions of the active area on a first side of the gate and forming in the substrate a first area of the first doping type, more heavily doped than the substrate, and forming in the active area, on a second side of the gate, a source area of the second doping type and bordered by the first area; (e) masking the portions of the active area on the second side of the gate and forming a drain area of the second doping type in the active area on the first side of the gate; and (f) forming a second area of the second doping type connecting the drain area to the buried layer.

According to an embodiment, steps (a), (b), (c), (d), and (e) are successive, step (f) being performed simultaneously to step (e) or before step (c).

According to an embodiment, step (e) is performed before step (d).

The foregoing features and advantages of embodiments of the present invention will be discussed in detail in the following non-limiting description of specific embodiments in connection with the accompanying drawings.

DETAILED DESCRIPTION

Figure 1:
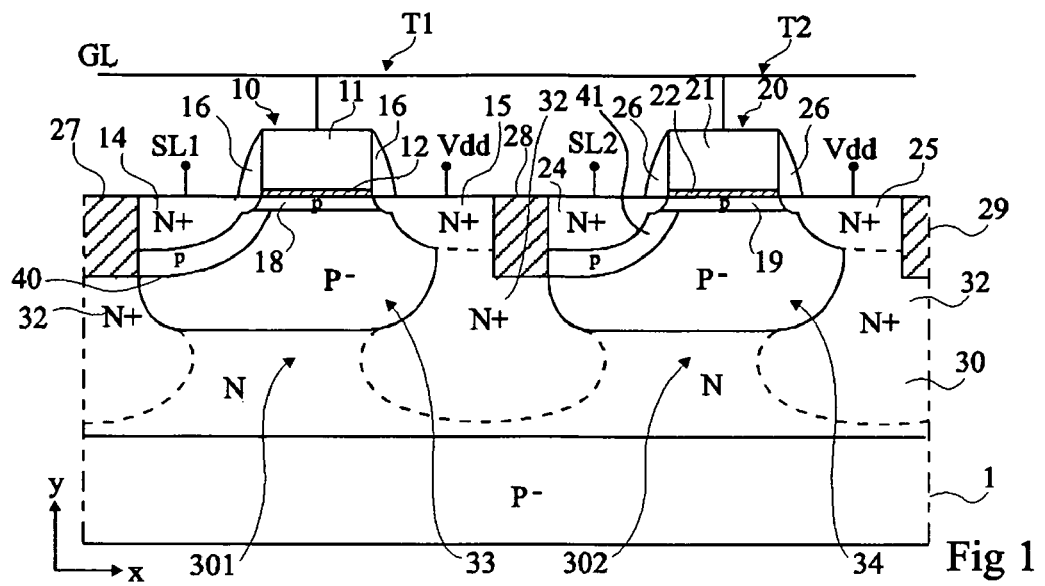
FIG. 1 is a partial simplified cross-section view of a sensor according to one embodiment of the present invention.

For clarity, the same elements have been designated with the same reference numerals in the different drawings and, further, as usual in the representation of integrated circuits, the various drawings are not to scale.

The following discussion is presented to enable a person skilled in the art to make and use the invention. Various modifications to the embodiments will be readily apparent to those skilled in the art, and the generic principles herein may be applied to other embodiments and applications without departing from the spirit and scope of the present invention as defined by the appended claims. Thus, the present invention is not intended to be limited to the embodiments shown, but is to be accorded the widest scope consistent with the principles and features disclosed herein.

FIG. 1 is a cross-section view of an example of an image sensor comprising two pixels according to one embodiment of the present invention. The sensor is formed in a semiconductor substrate 1, lightly P-type doped in this example. Each pixel comprises an NMOS transistor T1, T2. Each transistor comprises a gate 10, 20 formed of a conductive portion 11, 21 placed on the substrate and insulated therefrom by an insulating portion 12, 22. Each transistor further comprises a source area 14, 24 and a drain area 15, 25 heavily N-type doped formed at the surface of the substrate on either side of gate 10, 20. Insulating spacers 16, 26 are formed against the sides of gates 10, 20. It should be noted that source areas 14, 24 and drain areas 15, 25 comprise, in this example, thin lightly-doped N-type areas placed under insulating spacers 16 and 26. Further, the surface portion of the substrate placed between the source and drain areas of each transistor T1, T2, under its gate, forms a channel area.

The sensor pixels and more specifically transistors T1, T2 are insulated from one another by shallow insulating areas. Portions 27, 28, 29 of these insulating areas are shown in FIG. 1, respectively to the left of source area 14 of transistor T1, between drain area 15 of transistor T1 and source area 24 of transistor T2, and to the right of drain area 25 of transistor T2.

An N-type doped buried semiconductor layer 30 is placed in P substrate 1 under transistors T1, T2. N-type doped access areas 32, more heavily doped than buried layer 30, are placed in substrate 1 and connect each drain area 15, 25 to buried layer 30 to enable an electric biasing thereof. Each access area 32 also extends under insulating portion 27, 28, 29 adjacent to the associated drain area 15, 25 and extends into buried layer 30. The substrate portions delimited by N buried layer 30 and laterally limited by access areas 32 form wells 33 and 34 of transistors T1 and T2.

According to an embodiment of the present invention, buried layer 30 is less heavily doped under the channel areas of transistors T1, T2 of the sensor pixels than under the insulating portions where access areas 32 extend. The less heavily doped portions of buried layer 30 form "pinch" areas 301 and 302. The function of the pinch areas is described in more detail in the following description.

P-type "reservoir" areas 18 and 19; more heavily doped than substrate 1, may be formed at the surface of substrate 1 under gates 10 and 20 at the level of the transistor channel areas. The thickness of reservoir areas 18 and 19 is substantially identical to that of the lightly-doped extensions of the source/drain areas of transistors T1, T2.

Transistors T1, T2 of each of the pixels are connected to conductive lines placed above substrate 1 in one or several insulating layers covering the substrate and the gates of transistors T1, T2. Conductive portions 11, 21 of gates 10, 20 are connected to a gate line GL. Source areas 14 and 24 are respectively connected to source lines SL1 and SL2. Drain areas 15 and 25 are connected to a supply voltage Vdd.

Each pixel comprises a P-type insulating area 40, 41 more heavily doped than the substrate which is provided under source area 14, 24 and which extends from insulating portion 27, 28 adjacent to source area 14, 24 to the channel of transistor T1, T2.

It should be noted that buried layer 30 is biased, in the example shown in FIG. 1, via access areas 32 and drain areas 15, 25 connected to supply voltage Vdd. Wells 33 and 34 are "floating", that is, not directly biased by a voltage source. Wells 33 and 34 are biased by various capacitive couplings with N buried layer 30 and the elements of transistors T1 and T2.

Figure 2:
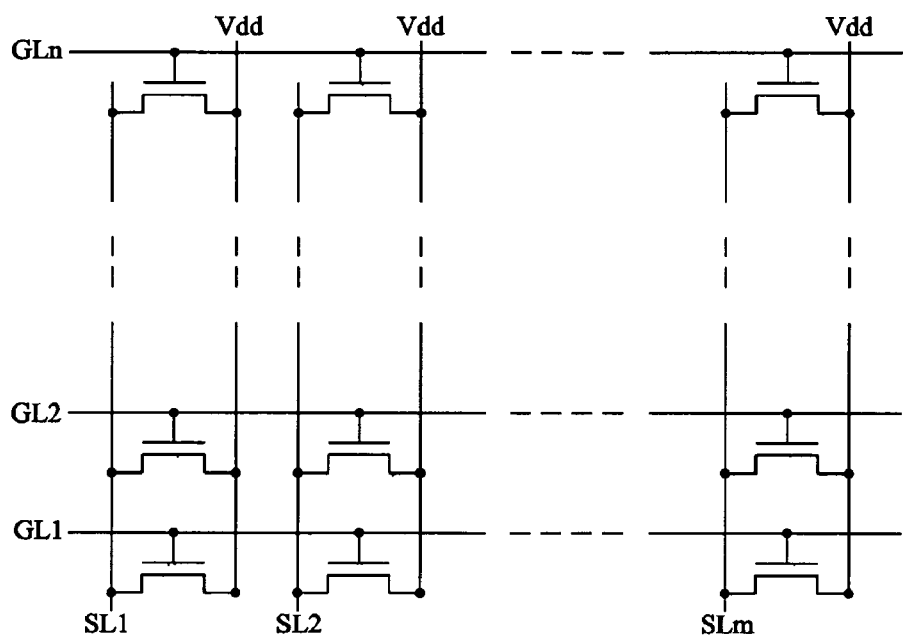
FIG. 2 is an electric diagram of a pixel array of an example of a sensor according to one embodiment of the present invention.

FIG. 2 is a diagram illustrating an example of an image sensor comprising a set of pixels arranged in the form of an array formed of n rows and of m columns of pixels. Only the transistors of each pixel are shown. The gates of the transistors of the pixels of the i-th row, with i ranging between 1 and n, are connected to a gate line GLi. The source areas of the transistors of the pixels of the j-th column, with j ranging between 1 and m, are connected to a source line SLj. The drain areas of the transistors are connected to voltage Vdd. Gate lines GL1 to GLn are connected to a control circuit. Source lines SL1 to SLm are connected to a read circuit.

The operation of the image sensor described hereabove depends on its use, for example according to whether it is used as a video camera or as a photographic camera. However, whatever its use, each sensor pixel performs a sequence of operations of three types: integration, reading, and reset. These operations are described hereafter for the sensor pixel shown to the right of FIG. 1 and comprising transistor T2.

In an integration operation, the pixel "captures" incident photons arriving in the upper portion of substrate 1 at the level of well 34. During this operation the gate line GL is biased to a low voltage, for example, the ground. Source line SL2 connected to source area 24 is in high impedance or biased to a voltage at least equal to the voltage of well 34 so that the PN diode formed by P well 34 and source area 24 is not conductive. When a photon is "captured", it generates an electron-hole pair in well 34 or in one of the space charge areas formed at the interfaces between P well 34 and N buried layer 30 or N source/drain areas 24, 25. The holes of the electron-hole pairs thus formed "naturally" are directed towards the area of lowest voltage, that is, towards P reservoir area 19 located under gate 20 when gate line GL is grounded or into well 34 close to P reservoir area 19 when gate line GL is biased to a positive voltage. The electrons are directed towards N buried layer 30 or source/drain areas 24 and 25. As a summary, during this integration operation, holes are accumulated in reservoir area 19 and/or in well 34.

It should be noted that the capture of photons at the level of the pixel wells is only possible if the photons can access these wells. The insulating layer(s) covering the substrate must thus be transparent. Further, the source/drain areas and the gates of the transistors forming the pixels must not be silicided, as frequent. Further, the gate material is preferably selected to be as little "absorbing" as possible or, in other words, as transparent as possible, so that photons arriving at the level of a gate can cross the latter to reach the substrate. An example of a particularly transparent gate material is zinc-doped indium oxide (ITO).

In a read phase, gate line GL is biased to a voltage V2 enabling turning on transistor T2. Voltage V2 is for example equal to 2 V in the case where supply voltage Vdd of the sensor is 3.6 V. The read circuit connected to source line SL2 for example comprises a current source "setting" a current through line SL2 and accordingly through transistor T2. The voltage of source area 24 then is a function of the amount of holes stored in well 34 and/or in reservoir area 19. The greater the number of stored holes, the higher the voltage of source area 24, and accordingly that of source line SL2. The read circuit comprises an evaluation circuit, such as an analog-to-digital converter, which defines a light intensity value received by the pixel according to the voltage value measured on source line SL2.

In a reset phase, gate line GL and source line SL2 are biased to supply voltage Vdd. The holes stored in well 34 and/or reservoir area 19 then direct towards substrate 1 through pinch area 302. Well 34 and/or reservoir area 19 thereby empty.

Figure 3:
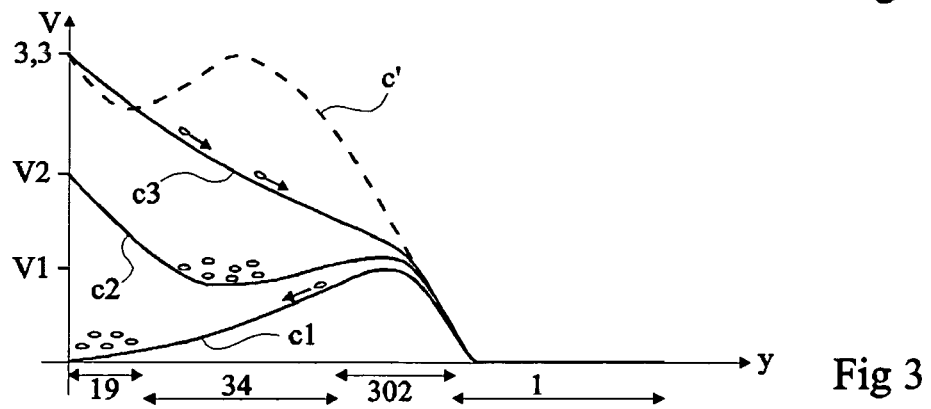
FIG. 3 is a diagram indicating the voltage variations in a pixel of the sensor shown in FIG. 1, between the surface and an internal portion of the substrate.

FIG. 3 is a diagram indicating the voltage variations through the pixel of the sensor shown to the right of FIG. 1 between reservoir area 19 and the P substrate portion located under pinch area 302. Three voltage curves c1, c2, and c3 are shown for each of the following operations: integration, reading and reset.

Further, a curve in dotted lines c' shows the voltage variations through this same pixel, above source area 24, through a more heavily doped portion of N buried layer 30. The curve is substantially identical whatever the performed operation.

It should be noted that the voltage of pinch area 302 varies little and that it is always much smaller than the internal voltage of a more heavily-doped portion of N buried layer 30. This voltage difference is due to the fact that pinch area 302 is fully depleted, conversely to a more heavily-doped portion of N buried layer 30. As an indication, when substrate 1 is grounded and N buried layer 30 is connected to a voltage Vdd on the order of 3.3 V, the voltage value of pinch area 302 is on the order of 1 V. The latter slightly fluctuates according to the performed operations.

In an integration operation (curve c1), the voltage in reservoir area 19, close to gate 20, is substantially zero when the gate is biased to 0 V. The voltage then progressively increases through reservoir area 19 and well 34 to reach a maximum value V1 towards the middle of pinch area 302. The voltage then progressively decreases from pinch area 302 to substrate 1. The gate can be supplied at a slightly positive voltage. In this case, the voltage dip, which corresponds to the hole storage area, may not be at the level of reservoir area 19, but in well 34 close to reservoir area 19, or at the limit between reservoir area 19 and well 34.

It should be noted that the voltage of the upper P areas, that is, of reservoir area 19 and of well 34, varies as the holes are being stored. The voltage of these higher P areas progressively increases along with the arrival of holes. In the case where a pixel receives many photons, it is possible for the voltage of these higher P areas to reach the value of voltage V1 of pinch area 302. In this case, "excess" holes in the upper P areas naturally direct towards substrate 1 through pinch area 302. The number of stored holes thus has an upper limit and the voltage of the upper P areas does not exceed value V1 in an integration operation.

Generally, the presence of a pinch area in each pixel enables limiting the voltage of the reservoir area and of the well of this pixel to a high voltage value substantially corresponding to voltage V1 of the pinch area. This feature enables avoiding "blooming" phenomena, consisting of a disturbance of a read operation from a pixel row due to a simultaneous integration operation by other strongly-lit pixels. In practice, if the voltage of the P well of a pixel in the integration phase can increase up to a voltage value greater than the voltage value present on source line SL connected to this pixel, then the PN diode formed by the P well and the source area of this pixel may turn on and disturb the ongoing read operation. To avoid blooming phenomena in a sensor comprising pixels according to embodiments of the present invention, it is enough to provide a read circuit such that the voltage of each source line cannot fall below voltage value V1. Voltage V1 being much lower than supply voltage Vdd of the sensor, those skilled in the art can easily form such a read circuit.

In a read operation (curve c2), the voltage in reservoir area 19, close to gate 20, is substantially equal to value V2 greater than V1. Voltage V2 is in this example equal to 2 V. The voltage then rapidly decreases away from gate 20 to reach a minimum in well 34, on the order of 0.8 V in this example. The voltage then progressively rises back up to pinch area 302, then decreases again towards substrate 1. It should be noted that the stored holes will no longer be confined close to the gate but "accumulate" in well 34.

In a reset operation (curve c3), the voltage in reservoir area 19, close to gate 20, is substantially equal to supply voltage Vdd, that is, 3.3 V in this example. The voltage then progressively decreases away from the gate. Accordingly, the holes previously stored in reservoir area 19 direct towards substrate 1.

It should be noted that the presence of a voltage dip in N buried layer 30 at the level of pinch area 302 enables easing the hole evacuation. Indeed, if there was no pinch area 302 under reservoir area 19, the hole evacuation through N buried layer 30 would require applying very high voltages on gate 20 and the source and drain areas 24 and 25.

An advantage of pixels according to embodiments of the present invention is that low voltages, equal to the "standard" supply voltage of the sensor, may be used to evacuate holes accumulated under the gate of the pixel transistor.

Figure 4:
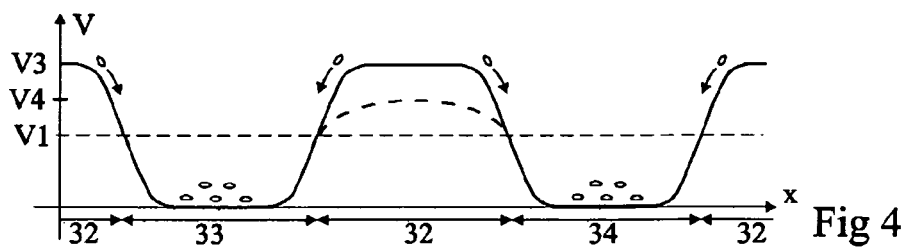
FIG. 4 is a diagram indicating the voltage variations through the wells and the areas of access to pixels of the sensor shown in FIG. 1.

FIG. 4 is a diagram indicating the voltage variations through wells 33, 34 and access areas 32 of the sensor pixels shown in FIG. 1 parallel to N buried layer 30 (along the axis x as indicated in FIG. 1). The voltage in the portions of wells 33, 34 located above pinch areas 301 and 302 is low and close to 0 V in this example. The voltage in access area 32 is "high" and equal to V3, on the order of 2 V in this example. The voltage "rises" at the level of access areas 32 enable performing an isolation between the hole storage areas of neighboring pixels. Thus, a hole generated in a well of a pixel in the vicinity of one of its drain or source areas "naturally" directs towards the inside of this well and then, possibly, towards the reservoir area located under the gate of this pixel.

An advantage of a sensor according to an embodiment of the present invention is that the sensor pixel transistors may be separated from one another by shallow insulation areas. In the case where the sensor belongs to an integrated circuit comprising various blocks performing various functions, the insulation areas separating the sensor pixels may be identical to the "conventional" insulation areas separating "standard" transistors from the other blocks of the integrated circuit.

Generally, the voltage of the lower portions of wells 33, 34 is mainly set by the capacitive couplings between these wells and N buried layer 30. It should however be noted that the voltage in the lower portion of a well further depends on the voltages applied to the elements of the transistor placed above. Thus, in a read operation, the voltage of a source area may switch from voltage Vdd to a lower voltage and cause a slight voltage drop in the peripheral well portion located under this source area.

P-type insulation area 40, 41 ensures a proper electric insulation of source areas 14, 24 with respect to buried region 30. Further, the access areas 32 provided for each pixel ensure a proper biasing of buried layer 30 while ensuring an electric insulation between wells 33, 34 of adjacent pixels.

An image sensor such as that shown in FIG. 1 may be fabricated through the method described hereafter in relation with FIGS. 5A to 5F. It should be understood that various doped regions are illustrated such as they appear after anneal steps which are not described.

Figure 5A:
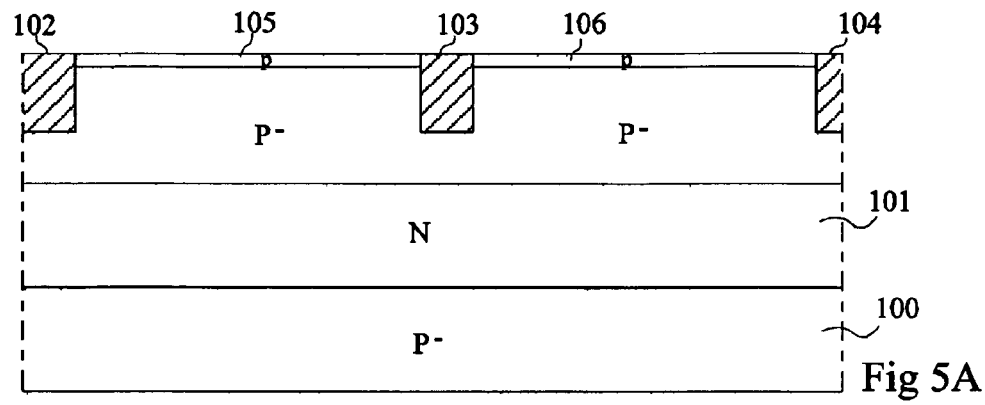
FIGS. 5A to 5F are cross-section views of structures obtained after successive steps of an example of a method for manufacturing the image sensor of FIG. 1.

In an initial step, illustrated in FIG. 5A, insulating areas 102, 103, 104 are formed in the upper portion of a lightly-doped substrate 100, for example, of type P. In top view, the insulating areas define upper substrate portions forming active areas of future transistors. An ion implantation of dopant elements is then performed in the substrate to form an N-type doped buried layer 101. An ion implantation of dopant elements is then performed at the surface of the active areas to form thin lightly-doped P-type layers 105, 106. An ion implantation of dopant elements is provided in the substrate to form a P-type doped buried layer, not shown, in the lower portion of buried layer 101 which causes a decrease in the dopant concentration of buried layer 101.

Figure 5B:
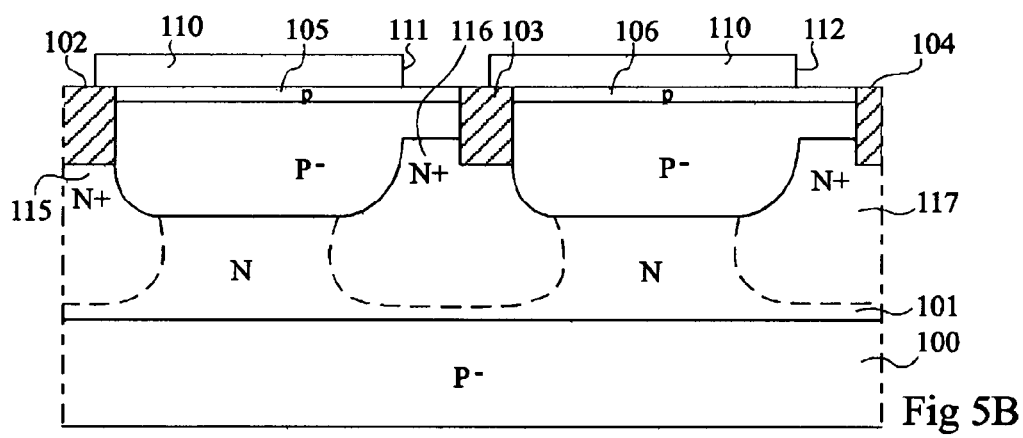

In a next step, illustrated in FIG. 5B, a resist layer 110 is deposited on substrate 100. This resin is insolated and developed to form openings 111, 112 therein at the level of insulating portions 102, 103, 104 and at the level of the adjacent portions of the active areas where the drain areas are intended to be formed. A high-energy ion implantation of dopant elements is then performed to form N-type doped buried regions 115, 116, 117, in the portion of substrate 100 located above buried layer 101 and under openings 111 and 112. Buried regions 115, 116, 117 extend in the buried layer 101 and thus cause an increase in the dopant concentration in buried layer 101, especially under insulating portions 102, 103, 104. Resin layer 110 is then eliminated.

Figure 5C:
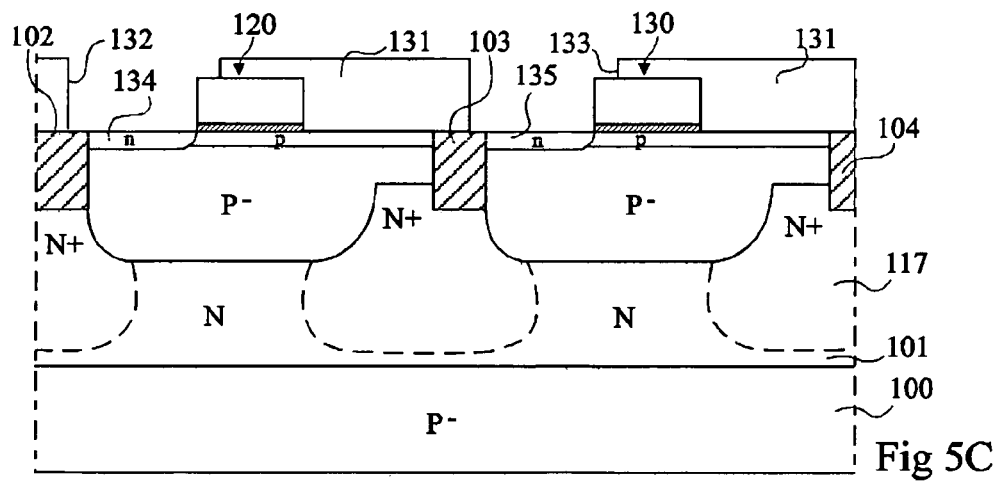

In a next step, illustrated in FIG. 5C, a thin dielectric layer, formed of silicon oxide, followed by a conductive layer, for example, made of polysilicon, are deposited on substrate 100. An etching of these two layers is then performed to form transistor gates 120, 130 each formed of a stacking of an insulating portion and of a conductive portion. A resist layer 131 is then deposited on substrate 100 and transistor gates 120, 130. This resin is insolated and developed to form openings 132, 133 therein above the portions of the active area in which the source areas are desired to be formed. An ion implantation of dopant elements is then performed to form lightly-doped N-type pre-source areas 134, 135 at the substrate surface.

Figure 5D:
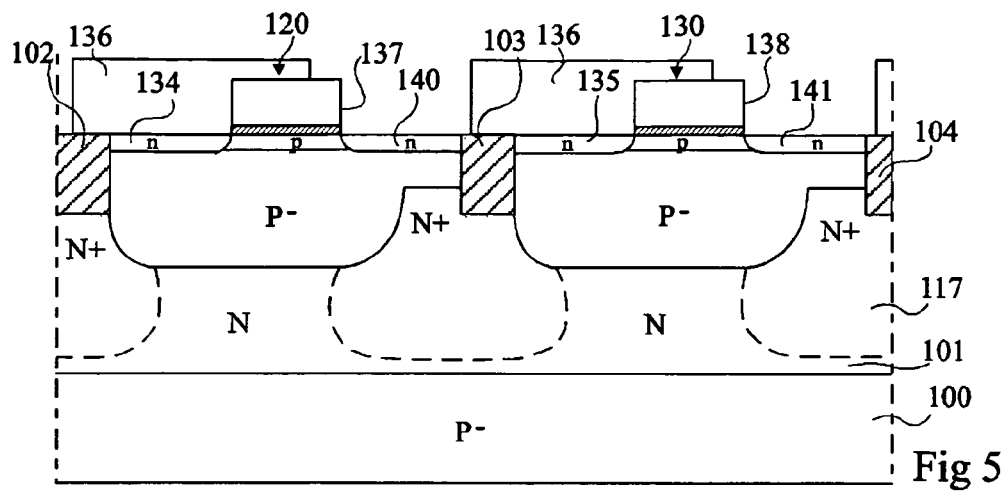

At a next step, illustrated in FIG. 5D, a resist layer 136 is deposited on substrate 100 and on transistor gates 120, 130. This resin is insolated and developed to form openings 137, 138 therein above the active area portions intended to form drain areas. An ion implantation of dopant elements is then performed to form lightly-doped pre-drain areas 140, 141 at the substrate surface.

According to a variation, the steps previously described in relation with FIGS. 5C and 5D may be carried out simultaneously by using transistor gates 120, 130 as masks to form the pre-source and drain areas 134, 135, 140, 141. According to another variation, the steps previously described in relation with FIGS. 5C and 5D are not present when it is not desirable to form the pre-source and drain areas.

Figure 5E:
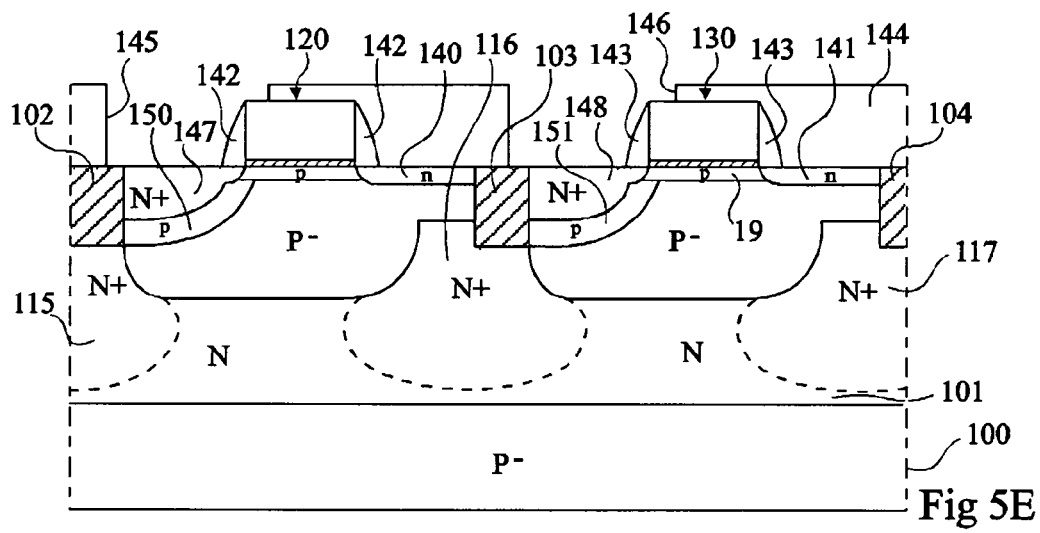

In a next step, illustrated in FIG. 5E, insulating spacers 142, 143 are formed against the side of gates 120, 130. A resist layer 144 is then deposited on the substrate and transistor gates 120, 130. This resin is insolated and developed to form openings 145, 146 therein above the active portions intended to form the source areas. An ion implantation of dopant elements is then performed in the substrate to form P-type insulation areas 150, 151 and an ion implantation of dopant elements in the upper portion of the substrate is performed to form N-type source areas 147, 148 on P-type insulation areas 150, 151. The mask used to form openings 145, 146 may be identical to the mask used, at the step previously described in relation with FIG. 5C, to form openings 132, 133.

Figure 5F:
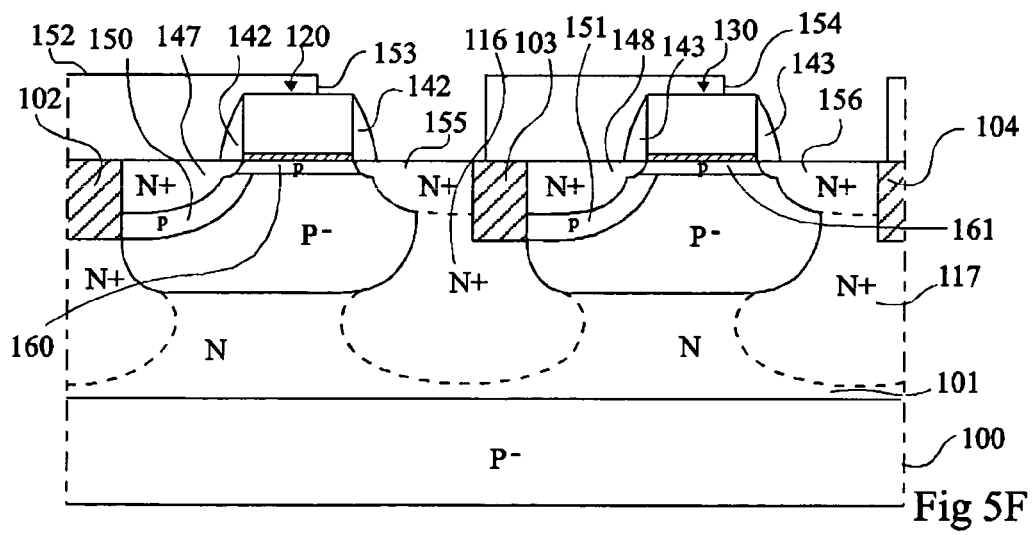

In a next step, illustrated in FIG. 5F, a resist layer 152 is deposited on substrate 100 and transistor gates 120, 130. This resin is insolated and developed to form openings 153, 154 therein above the portions of the active areas intended to form the drain areas. An ion implantation of dopant elements is then performed in the upper portion of the substrate to form N-type doped drain areas 155, 156. Drain areas 155, 156 extend to access areas 116, 117. The remaining portions of P-layers 105, 106 placed under gates 120, 130 form reservoir areas 160, 161. The mask used to form openings 153, 154 may be identical to the mask used, at the step previously described in relation with FIG. 5D, to form openings 137, 138.

As a non-limiting indication, the concentrations in dopant elements, in atoms/cm$^3$, in the different portions of the sensor shown in FIG. 5F are the following:

P substrate 100: $10^{15}$;
P reservoir pockets 160, 161: $2.10^{17}$;
P insulation areas 150, 151: $10^{18}$;
N buried layer 101 under transistors T1, T2: $10^{17}$;
N buried layer 101 under insulating portions 102, 103, 104: $5.10^{17}$;
source and drain areas 147/148/155/156: $10^{20}$.
N access areas 116, 117: $5.10^{17}$.

Further, as a non-limiting indication still, the dimensions of the different portions of the sensor shown in FIG. 5F are the following:

thickness of N buried layer 101: 1 μm;
depth of the wells (distance between the substrate surface and N buried layer 101): 1 μm;
depth of source/drain areas 147/148/155/156: 0.3 μm;
thickness of P insulation areas 150, 151: 0.2 μm;
depth of insulating portions 102-104: 0.5 μm;
thickness of reservoir areas 160, 161: 0.1 μm;
thickness of access areas 116, 117 between drain areas 155, 156 and N buried layer 101: 0.7 μm.

It should be noted that the above-mentioned dimensions are approximate since the concentration variations between two areas of different doping are progressive.

Another example of a method for manufacturing the image sensor shown in FIG. 1 will now be described in relation with FIGS. 6A to 6E.

Figure 6A:
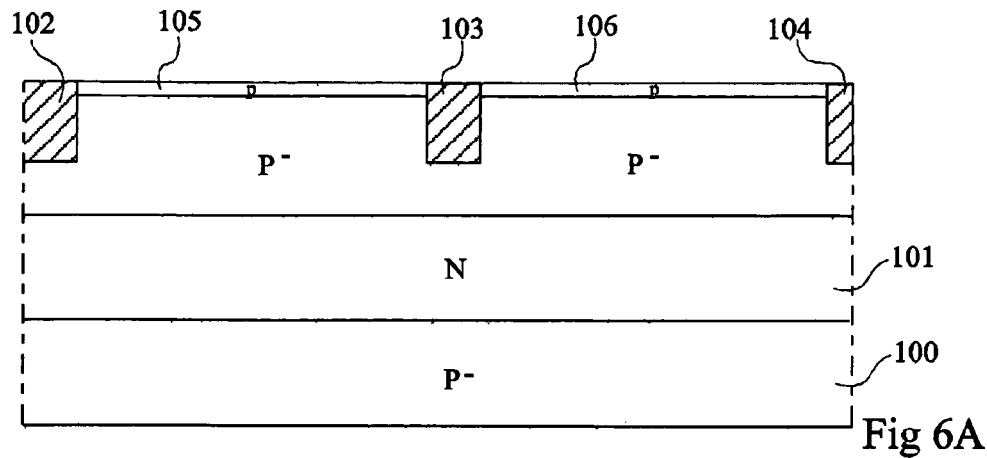
FIGS. 6A to 6E are cross-section views of structures obtained after successive steps of another example of a method for manufacturing the image sensor of FIG. 1.

The structure obtained in FIG. 6A is identical to that obtained in FIG. 5A.

Figure 6B:
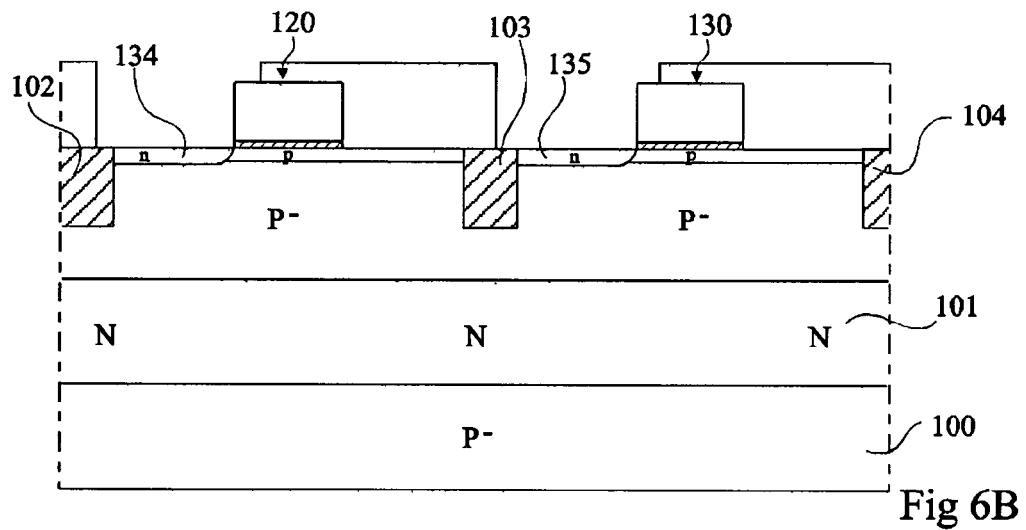

In a next step, illustrated in FIG. 6B, transistors 120, 130 have been formed on substrate 100 and the steps previously described in relation with FIG. 5C have been implemented. This results in the forming of pre-source areas 134, 135.

Figure 6C:
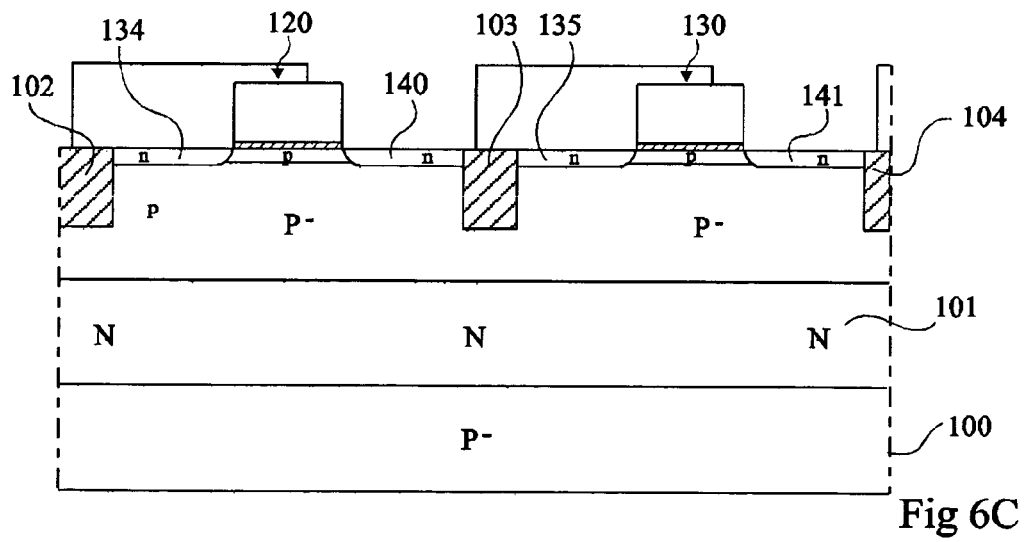

In a next step, illustrated in FIG. 6C, the steps previously described in relation with FIG. 5D are implemented. This results in the forming of pre-drain areas 140, 141.

Figure 6D:
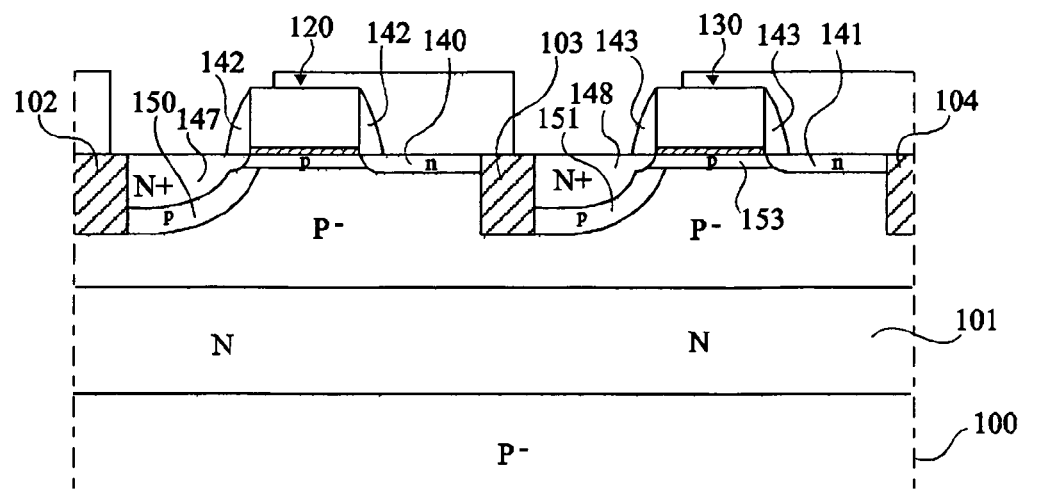

In a next step, illustrated in FIG. 6D, the steps previously described in relation with FIG. 5E are implemented. This results in the forming of source areas 147, 148 and P-type doped insulation areas 150, 151.

Figure 6E:
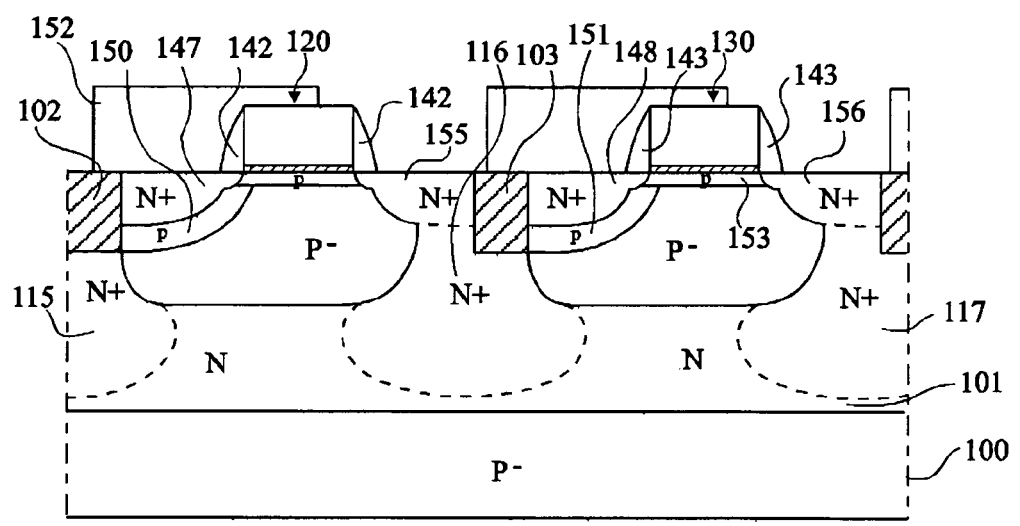

In a next step, illustrated in FIG. 6E, the steps previously described in relation with FIG. 5F are implemented. This results in the forming of drain areas 155, 156. Further, mask 152 and the gates of transistors 120, 130 are used as a mask for the forming of access areas 115, 116, 117. For this purpose, it is necessary for the thicknesses of gates 120, 130 and/or the energies implemented to form areas 115, 116, 117 to be sufficient for gates 130, 120 to be usable to define access areas 115, 116, 117.

Image sensors including embodiments of the present invention can be contained in a variety of different types of electronic devices, such as cellular telephones, digital cameras, video cameras, and so on.

Specific embodiments of the present invention have been described. Various alternatives and modifications will occur to those skilled in the art. In particular, pixels having semiconductor elements with dopings opposite to those of the pixels shown in FIG. 1 may be formed. Such a pixel would comprise a P-channel transistor (PMOS) formed in and above an N-type substrate comprising a buried P-type layer, P-type drain/source areas, a P-type access area connecting the drain area to the buried layer, and an N-type insulation area under the source area.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A pixel comprising:
   a semiconductor substrate of a first doping type;
   a first layer of the second doping type covering the substrate;
   a second layer of the first doping type covering the first layer;
   a MOS-type transistor formed in the second layer and having a drain area and a source area of the second doping type, and
   a first area of the second doping type, more heavily doped than the first layer, crossing the second layer and extending into the first layer, and connected to the drain area;
   a second area of the first doping type, more heavily doped than the second layer and bordering the source area;
   a portion of an insulating material placed in the second layer and surrounding the transistor, said first area extending under the portion of insulating material; and
   wherein the second area extends from the portion of insulating material to a channel area of the transistor.

2. The pixel of claim 1, comprising a reservoir area of the same doping type as the second layer but more heavily doped than said layer placed at the level of the channel area, at the surface of the second layer.

3. The pixel of claim 1, wherein the transistor comprises an insulated gate placed above the second layer, the source/drain areas being placed on either side of the gate in the upper portion of the second layer, the surface portion of the second layer located between the source/drain areas and under the gate forming the channel area of the transistor.

4. The pixel of claim 3, wherein the gate and the source/drain areas of the transistor are connected to conductive lines placed above the second layer, the transistor well being floating.

5. An image sensor comprising pixels of claim 1, wherein the second layers of the pixels form one and the same layer.

6. The pixel of claim 1 wherein the first doping type is p-type and the second doping type is n-type.

7. A pixel for an image sensor, the pixel including a transistor and being formed in a semiconductor substrate having a first conductivity type with a first layer of a second conductivity type being formed on the substrate and a second layer having the first conductivity type being formed on the first layer, the transistor comprising:
   a drain region of the transistor formed in the second layer, the drain region having the second conductivity type;
   a source region of the transistor formed in the second layer, the source region having the second conductivity type and having a lower portion at a distance from a surface of the second layer;
   a gate structure formed on the second layer, the gate structure being positioned between the source and drain regions;
   a first region formed in the second layer and extending into the first layer, the first region being physically connected to the drain region and having the second conductivity type, the first region having a dopant concentration that is greater than a dopant concentration of the first layer;
   a second region having the first conductivity type formed in the second layer, the second region being formed between the lower portion of the source region and the second layer, and the second region having the first conductivity type and having a dopant concentration that is greater than a dopant concentration of the second layer;
   an insulating region formed in the second layer surrounding the transistor, the insulating region being formed adjoining the source region and the first region extending under the insulating region in the first layer; and
   wherein a channel region of the transistor is defined in the second layer between the source and drain regions, and wherein the second region extends in the second layer from the insulating region to the channel region.

8. The pixel of claim 7 further comprising a reservoir region formed in the channel region of the second layer, the reservoir region having the first conductivity type and having a dopant concentration greater than a dopant concentration of the second layer.

9. The pixel of claim 7 wherein the insulating region is transparent to photons the transistor is operable to sense.

10. The pixel of claim 7 wherein the drain region is coupled to a supply voltage source.

11. The pixel of claim 8 wherein the gate structure comprises:
    a gate insulating layer formed over the reservoir region;
    a conductive gate region formed on the gate insulating layer; and
    insulating spacers formed surrounding the gate insulating layer and conductive gate region.

12. The pixel of claim 11 wherein the pixel further comprises lightly doped regions having the second conductivity type formed in the second layer adjacent the insulating spacers.

13. A pixel for an image sensor, the pixel including a transistor and being formed in a semiconductor substrate having a first conductivity type with a first layer of a second conductivity type being formed on the substrate and a second layer having the first conductivity type being formed on the first layer, the transistor comprising:
    a drain region of the transistor formed in the second layer, the drain region having the second conductivity type;
    a source region of the transistor formed in the second layer, the source region having the second conductivity type and having a lower portion at a distance from a surface of the second layer;
    a gate structure formed on the second layer, the gate structure being positioned between the source and drain regions;
    a first region having the second conductivity type formed in the second layer, the first region adjoining the drain region and extending into the first layer to define a pinch region in the first layer between the second layer and the substrate;

a second region having the first conductivity type formed in the second layer, the second region being formed between the lower portion of the source region and the second layer, and the second region having the first conductivity type and having a dopant concentration that is greater than a dopant concentration of the second layer;

an insulating region formed in the second layer surrounding the transistor, the insulating region being formed adjoining the source region and the first region extending under the insulating region in the first layer; and a channel region of the transistor defined in the second layer between the source and drain regions, wherein the second region extends in the second layer from the insulating region to the channel region.

14. The pixel of claim 13 wherein the transistor is operable to generate a voltage responsive to photons incident upon the pixel.

15. An electronic device, comprising:

electronic circuitry including a image sensor array, the image sensor array comprising an array of pixels arranged in rows and columns, each pixel including a transistor and each transistor in a respective row having a gate coupled to a corresponding gate line and each transistor in a respective column having a source region coupled to a corresponding source line and a drain region of each transistor being adapted to receive a supply voltage, wherein the transistor of each pixel is formed in a semiconductor substrate having a first conductivity type with a first layer of a second conductivity type being formed on the substrate and a second layer having the first conductivity type being formed on the first layer, the transistor comprising:

the drain region of the transistor formed in the second layer, the drain region having the second conductivity type;

the source region of the transistor formed in the second layer, the source region having the second conductivity type and having a lower portion at a distance from a surface of the second layer;

a gate structure formed on the second layer, the gate structure being positioned between the source and drain regions;

a first region formed in the second layer and extending into the first layer, the first region being physically connected to the drain region and having the second conductivity type, the first region having a dopant concentration that is greater than a dopant concentration of the first layer;

a second region having the first conductivity type formed in the second layer, the second region being formed between the lower portion of the source region and the second layer, and the second region having the first conductivity type and having a dopant concentration that is greater than a dopant concentration of the second layer;

an insulating region formed in the second layer surrounding the transistor, the insulating region being formed adjoining the source region and the first region extending under the insulating region in the first layer; and a channel region of the transistor defined in the second layer between the source and drain regions, wherein the second region extends in the second layer from the insulating region to the channel region.

16. The electronic device of claim 15 wherein the electronic circuitry comprises digital camera circuitry for a video camera or a digital still camera.

17. The electronic device of claim 16 wherein the image sensor operates in an integration mode during which the gate lines of the array are biased to a low voltage and the source lines are coupled to a high impedance node or are biased to a voltage at least equal a voltage of a well of each transistor defined in the second layer.

18. The electronic device of claim 17 wherein the image sensor is operable in a read mode during which the gate lines of the array are biased to a voltage sufficient to turn on the transistors and a read circuit coupled to each source line comprises a current source.

19. The electronic device of claim 17 wherein the image sensor is operable in a reset mode during which the gate lines and source lines of the array are biased to a supply voltage.

20. The electronic device of claim 15 wherein first conductivity type is p-type and the second conductivity type is n-type.

* * * * *